(12) United States Patent
Heo et al.

(10) Patent No.: US 9,071,251 B2
(45) Date of Patent: Jun. 30, 2015

(54) PHASE-LOCKED LOOP OUTPUTS WITH REDUCED REFERENCE SPURS AND NOISE

(71) Applicant: WASHINGTON STATE UNIVERSITY, Pullman, WA (US)

(72) Inventors: Deukhyoun Heo, Pullman, WA (US); Pawan Agarwal, Pullman, WA (US)

(73) Assignee: WASHINGTON STATE UNIVERSITY, Pullman, WA (US)

( * ) Notice: Subject to any disclaimer, the term of this patent is extended or adjusted under 35 U.S.C. 154(b) by 0 days.

(21) Appl. No.: 14/002,055

(22) PCT Filed: Apr. 22, 2013

(86) PCT No.: PCT/US2013/037643
§ 371 (c)(1),
(2) Date: Aug. 28, 2013

(87) PCT Pub. No.: WO2014/175859
PCT Pub. Date: Oct. 30, 2014

(65) Prior Publication Data
US 2014/0312942 A1    Oct. 23, 2014

(51) Int. Cl.
H03L 7/08    (2006.01)
(52) U.S. Cl.
CPC .......................................... *H03L 7/08* (2013.01)
(58) Field of Classification Search
CPC ........ H03L 7/18; H03L 7/0891; H03L 7/0814
USPC .......................................... 327/147, 156, 158
See application file for complete search history.

(56) References Cited

U.S. PATENT DOCUMENTS

| | | | | |
|---|---|---|---|---|
| 6,816,019 | B2* | 11/2004 | Delbo' et al. | 331/17 |
| 7,616,075 | B2* | 11/2009 | Kushiyama | 331/186 |
| 8,044,692 | B2* | 10/2011 | Bazes | 327/156 |
| 8,258,877 | B2 | 9/2012 | Goel et al. | |
| 2007/0247248 | A1 | 10/2007 | Kobayashi et al. | |
| 2008/0284524 | A1 | 11/2008 | Kushiyama | |

OTHER PUBLICATIONS

Chun-Yi Kuo; Jung-Yu Chang; Shen-Iuan Liu; , "A spur-reduction technique for a 5-GHz frequency synthesizer," Circuits and Systems I: Regular Papers, IEEE Transactions on , vol. 53, No. 3, pp. 526-533, Mar. 2006.

(Continued)

*Primary Examiner* — John Poos
(74) *Attorney, Agent, or Firm* — Maschoff Brennan (57) ABSTRACT

In some examples, a circuit is described. The circuit may include a voltage-controlled oscillator that may be configured to generate an output signal. The circuit may also include a control signal generation unit that may be configured to generate a control signal based on the output signal. The control signal generation unit may also be configured to provide the control signal to the voltage-controlled oscillator. The voltage-controlled oscillator and the control signal generation unit may be part of a phase-locked loop (PLL) included in the circuit. The circuit may also include a feed-forward network. The feed-forward network may be configured to provide a portion of the control signal to the voltage-controlled oscillator. The voltage-controlled oscillator may generate the output signal based on the control signal from the control signal generation unit and the portion of the control signal from the feed-forward network.

20 Claims, 6 Drawing Sheets

(56) References Cited

OTHER PUBLICATIONS

Charles, C.T.; Allstot, D.J., "A Calibrated Phase/Frequency Detector for Reference Spur Reduction in Charge-Pump PLLs," Circuits and Systems II: Express Briefs, IEEE Transactions on , vol. 53, No. 9, pp. 822-826, Sep. 2006.

Arakali, A.; Gondi, S.; Hanumolu, P.K., "Low-Power Supply-Regulation Techniques for Ring Oscillators in Phase-Locked Loops Using a Split-Tuned Architecture," Solid-State Circuits, IEEE Journal of , vol. 44, No. 8, pp. 2169-2181, Aug. 2009.

Gupta, V.; Rincon-Mora, G.A.; Raha, P., "Analysis and design of monolithic, high PSR, linear regulators for SoC applications," SOC Conference, 2004. Proceedings. IEEE International , vol., no., pp. 311-315, Sep. 12-15, 2004.

Wang, Kevin Jia-Nong, Spur Reduction Techniques for Fractional-N PLLs, University of California San Diego, Sep. 2011.

Temporiti, E. et al., "A 3.5 GHz Wideband ADPLL With Fractional Spur Suppression Through TDC Dithering and Feedforward Compensation," vol. 45 , Issue: Dec. 12, 2010.

International Search Report and Written Opinion dated Jun. 27, 2013 in application No. PCT/US2013/037643.

* cited by examiner

PHASE-LOCKED LOOP OUTPUTS WITH REDUCED REFERENCE SPURS AND NOISE

CROSS-REFERENCE TO RELATED APPLICATION

The present application is a U.S. national stage filing under 35 U.S.C. §371 of International Application No. PCT/US2013/037643, filed on Apr. 22, 2013.

BACKGROUND

Unless otherwise indicated herein, the materials described herein are not prior art to the claims in the present application and are not admitted to be prior art by inclusion in this section.

Phase-locked loops (PLL) have been applied to many applications ranging from generating clock signals in microprocessors to synthesizing frequencies. In general, a PLL may include a voltage-controlled oscillator (VCO) that generates an output signal with a frequency that is locked onto a frequency of an input signal (a reference signal). To lock the frequency of the output signal with the frequency of the input signal, a PLL may include a phase frequency detector (PFD) configured to compare the phase of the reference signal to the phase of the output signal generated by the oscillator, and to generate a PFD output that is proportional to the phase difference between the phase of the input signal and the phase of the output signal. Through the feedback of the output signal to the PFD, the PLL drives the frequency of the output signal to the frequency of the input signal and matches the phase of the output signal with the phase of the input signal.

SUMMARY

Techniques described herein generally relate to phase-locked loop outputs with reduced noise.

In some examples, a circuit may include a voltage-controlled oscillator that may be configured to generate an output signal. The circuit may also include a control signal generation unit that may be configured to generate a control signal based on the output signal. The control signal generation unit may also be configured to provide the control signal to the voltage-controlled oscillator. The circuit may also include a feed-forward network. The feed-forward network may be configured to provide a portion of the control signal to the voltage-controlled oscillator. The voltage-controlled oscillator may generate the output signal based on the control signal from the control signal generation unit and the portion of the control signal from the feed-forward network.

In some examples, a circuit may include a control signal generation unit that may be configured to generate a control signal based on a phase difference between an output signal and a reference signal. The control signal may include an alternating current component. The circuit may also include a voltage regulator coupled to the control signal generation that may be configured to generate a reference voltage signal that includes at least a portion of the alternating current component of the control signal. The circuit may also include a voltage-controlled oscillator coupled to the control signal generation unit that may be configured to generate a tuning signal based on the control signal and the reference voltage signal. The voltage-controlled oscillator may also be configured to generate the output signal based on the tuning signal.

In some examples, a circuit may include a control signal generation unit that may be configured to generate a control signal based on a phase difference between an output signal and a reference signal. The control signal may include an alternating current component. The circuit may also include a voltage-controlled oscillator coupled to the control signal generation unit that may be configured to generate a tuning signal based on the control signal and a reference voltage signal. The reference voltage signal may include at least a portion of the alternating current component of the control signal. The voltage-controlled oscillator may also be configured to generate the output signal based on the tuning signal.

In some examples, a method of reducing noise in an output of a phase-locked loop may include generating a control signal based on a phase difference between an output signal and a reference signal. The control signal may include an alternating current component. The method may also include generating a tuning signal based on the control signal and a reference voltage signal. The reference voltage signal may include at least a portion of the alternating current component of the control signal. The method may also include generating the output signal based on the tuning signal.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus/circuits, systems, etc. related to phase-locked loops (PLLs) and in particular to reducing reference spurs in an output signal generated by a PLL using a feed-forward network.

Briefly stated, in some examples, a circuit is described. The circuit may include a voltage-controlled oscillator that may be configured to generate an output signal. The circuit may also include a control signal generation unit that may be configured to generate a control signal based on the output signal. The control signal generation unit may also be configured to provide the control signal to the voltage-controlled oscillator. The voltage-controlled oscillator and the control signal generation unit may be part of a PLL included in the circuit. The circuit may also include a feed-forward network. The feed-forward network may be configured to provide a portion of the control signal to the voltage-controlled oscillator. The voltage-controlled oscillator may generate the output signal based on the control signal from the control signal generation unit and the portion of the control signal from the feed-forward network.

Figure 1:
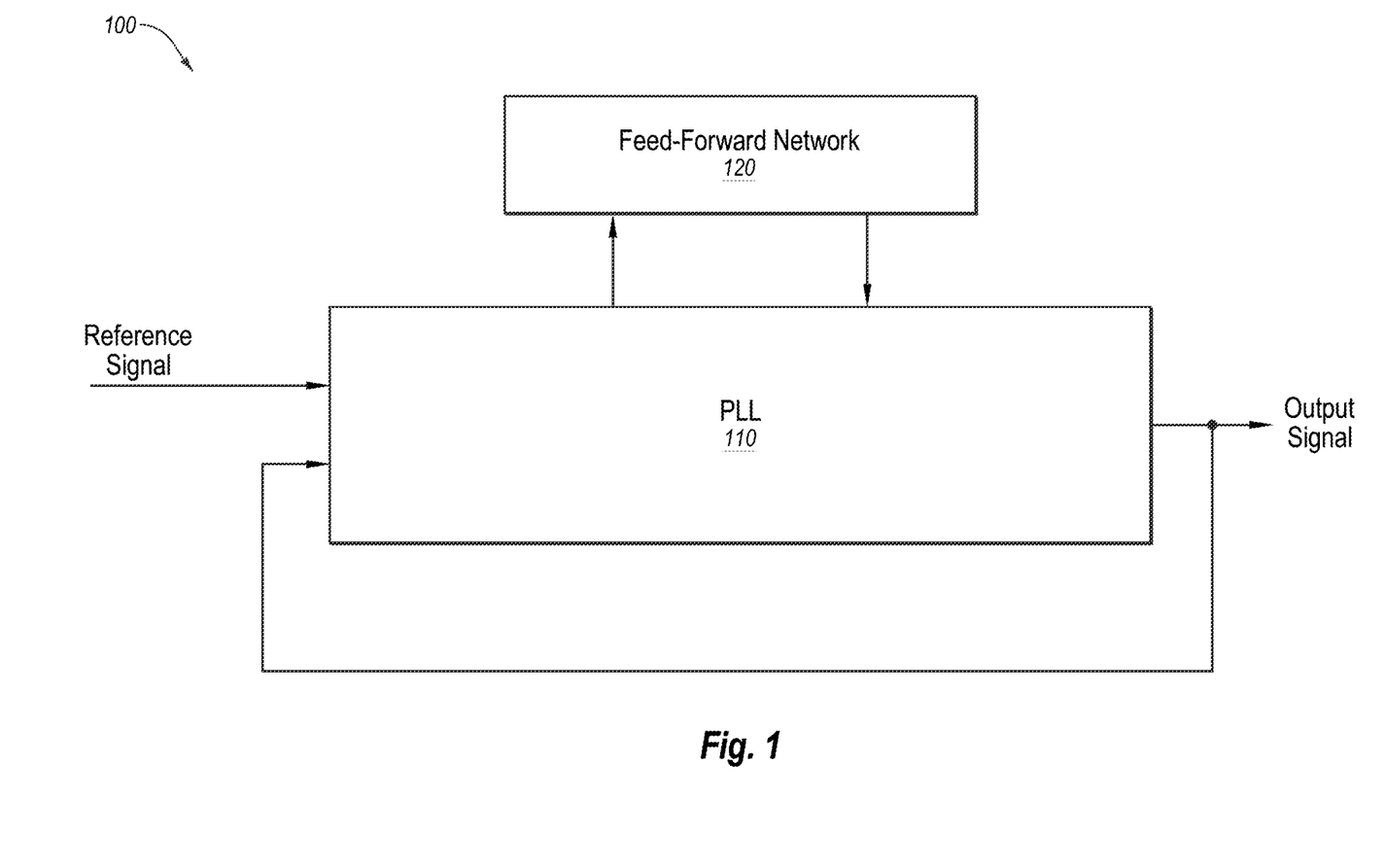
FIG. 1 is a block diagram of an example circuit that includes a phase-locked loop (PLL) with a feed-forward network.

FIG. 1 is a block diagram of an example circuit 100 that includes a phase-locked loop (PLL) 110 with a feed-forward network 120, arranged in accordance with at least some embodiments described herein. The PLL 110 may be configured to generate an output signal with a frequency that is locked onto a frequency of a reference signal. The generation of the output signal may be controlled by an internal control signal that is based on the difference between the reference signal and the output signal. In some embodiments, the internal control signal may be noisy, e.g. may include undesired alternating current (AC) components, e.g., components with a frequency greater than zero, resulting from non-idealities in the PLL 110.

The noisy control signal may result in the output signal being noisy. In particular, the noisy control signal may result in the output signal having reference spurious signals, within the frequency spectrum of the output signal of the PLL 110, that are undesired. The reference spurious signals may occur at frequencies within the frequency spectrum of the output signal of the PLL 110 that are a fundamental frequency of the reference signal and/or one or more harmonic frequencies of the reference signal, such as a first, second, and/or third harmonic frequencies of the reference signal. In some embodiments, the reference spurious signals may have frequencies that are outside a loop bandwidth of the PLL 110. As a result, the PLL 110 may be unable to compensate for the reference spurious signals.

To reduce the noise, e.g., the reference spurious signals, within the frequency spectrum of the output signal of the PLL 110, the internal control signal or a portion of the internal control signal may be provided to the feed-forward network 120. In some embodiments, the feed-forward network 120 may be configured to filter the received internal control signal and provide at least a portion of the undesired AC components of the internal control signal back to the PLL 110. For example, the feed-forward network 120 may include a transfer function that acts as a band-pass filter. The portion of the undesired AC components of the internal control signal provided to the PLL 110 may be a portion of the AC components within the pass band associated with the band-pass filter characteristics of the feed-forward network 120. In some embodiments, the lower cut-off frequency of the pass band may be higher than a loop bandwidth frequency of the PLL 110. Maintaining the lower cut-off frequency of the pass band higher than the loop bandwidth frequency of the PLL 110 may increase stability of the PLL 110. Maintaining the lower cut-off frequency of the pass band higher than the loop bandwidth frequency of the PLL 110 may also reduce or avoid reduction in the phase margin of the PLL 110 due to the addition of the feed-forward network 120.

The PLL 110 may be configured to use at least a portion of the undesired AC components of the internal control signal received from the feed-forward network 120 to reduce an amplitude of at least a portion of the undesired AC components of the internal control signal within the PLL 110 used to control the generation of the output signal. As a result, the noise and reference spurs in the output signal may be reduced.

Figure 2:
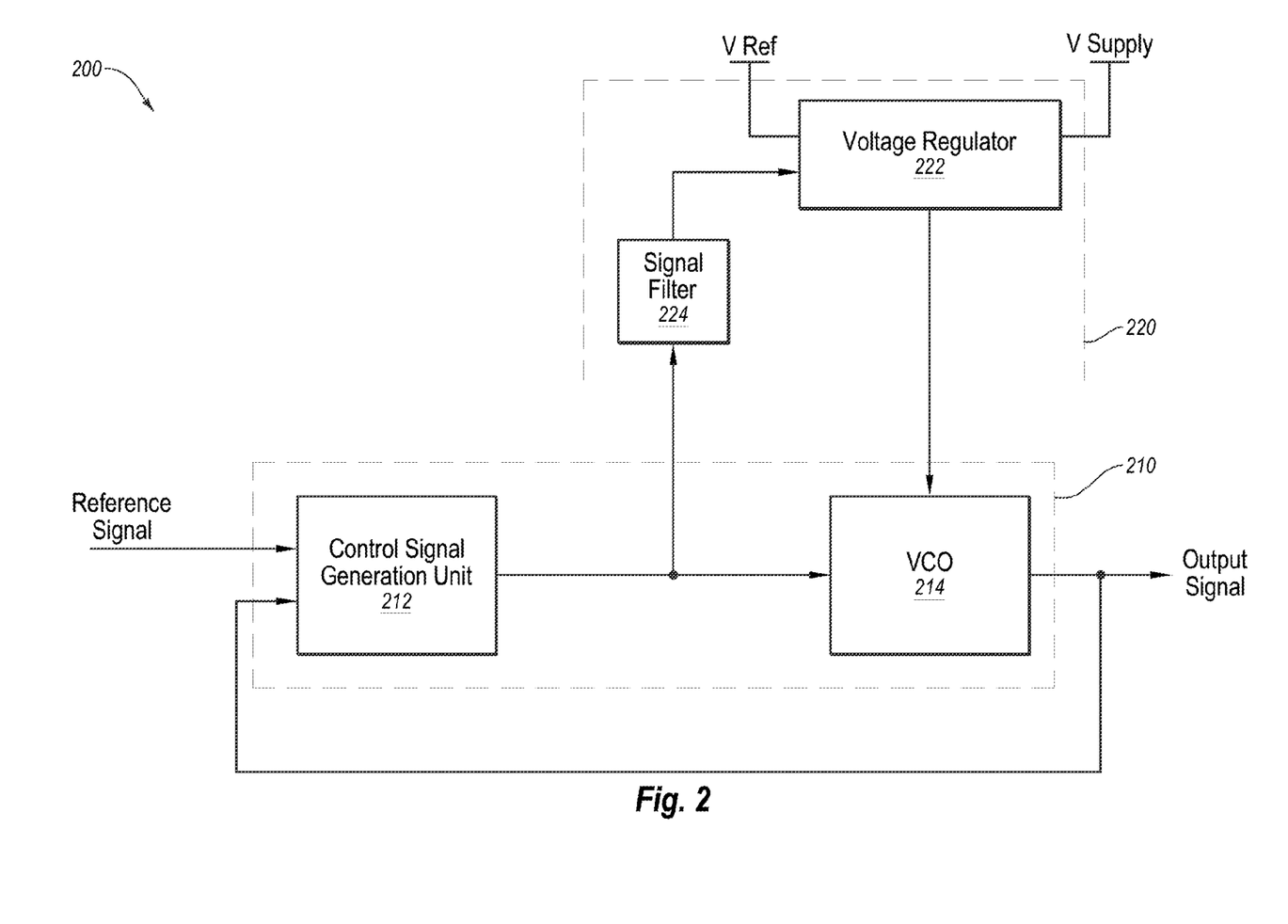
FIG. 2 is a block diagram of another example circuit that includes a PLL with a feed-forward network.

FIG. 2 is a block diagram of another example circuit 200 that includes a PLL 210 with a feed-forward network 220, arranged in accordance with at least some embodiments described herein. In the illustrated embodiment, the PLL 210 may be configured to generate an output signal with a frequency that is locked onto a frequency of a reference signal. To generate the output signal, the PLL 210 may include a control signal generation unit 212 and a voltage-controlled oscillator (VCO) 214 coupled to the control signal generation unit 212. The control signal generation unit 212 may be configured to generate a control signal based on the output signal and the reference signal that are received as inputs to the control signal generation unit 212. In some embodiments, the control signal generation unit 212 may be configured to generate the control signal based on a phase difference between the output signal and the reference signal.

In some embodiments, the control signal may be a voltage signal that includes an alternating current component and a direct current (DC) component. Ideally, the control signal may include a DC component and no AC component. Due to non-idealities in the PLL 210, such as reference signal feed-through in the control signal generation unit 212, current mismatches in the control signal generation unit 212, timing errors in the control signal generation unit 212, and/or other factors, however, the control signal may include an AC component. The control signal generation unit 212 may be configured to send the control signal toward the VCO 214 and the feed-forward network 220.

The VCO 214 may be configured to receive the control signal and to generate the output signal based on the control signal. In particular, the frequency of the output signal may be proportional to an amplitude of the DC component of the control signal. The AC component of the control signal may be up-converted by the VCO 214 and result in noise, e.g., reference spurious signals, in the output signal.

The feed-forward network 220 may include a voltage regulator 222 coupled to the VCO 214 and a signal filter 224 coupled to the voltage regulator 222 and to the control signal generation unit 212, and may be configured to receive the control signal from the control signal generation unit 212 and to provide a portion of the control signal to the VCO 214. The portion of the control signal provide to the VCO 214 by the feed-forward network 220 may include a portion of the AC component of the control signal.

In some embodiments, the control signal may be received by the signal filter 224 in the feed-forward network 220. The signal filter 224 may be configured to filter the control signal and to provide a corresponding filtered control signal to the voltage regulator 222. In these and other embodiments, filtering the control signal may remove the DC component of the control signal. In some embodiments, the signal filter 224 may also be configured to remove a portion of the AC component of the control signal. For example, in some embodiments, the signal filter 224 may be configured to remove a portion of the AC component of the control signal that is within a loop bandwidth of the PLL 210. In these and other embodiments, the signal filter 224 may thus be configured as a high-pass filter with a cut-off frequency that is higher than the loop bandwidth of the PLL 210. The signal filter 224 may send the filtered control signal to the voltage regulator 222.

The voltage regulator 222 may be configured to generate a reference voltage. The reference voltage may be generated based on a reference voltage source (V Ref) and a voltage supply (V Supply) provided to the voltage regulator 222. The voltage regulator 222 may be further configured to generate a reference voltage signal that includes the reference voltage and a portion of the control signal. The portion of the control signal may be based on the filtered control signal received from the signal filter 224. The voltage regulator 222 may provide the reference voltage signal, and thus the portion of the control signal, to the VCO 214. In this manner, the feed-forward network 220 may provide the portion of the control signal to the PLL 210 and, in particular, to the VCO 214 of the PLL 210.

In some embodiments, the portion of the control signal included in the reference voltage signal may include a low pass filtered version of the filtered control signal provided by the signal filter 224. The voltage regulator 222 may have a transfer function that results in the voltage regulator 222 acting as a low pass filter with respect to the filtered control signal. With the voltage regulator 222 acting as a low-pass filter and the signal filter 224 acting as a high-pass filter, the portion of the control signal provided by the feed-forward network 220 to the VCO 214 may be a band-pass filtered portion of the control signal. As a result, in some embodiments, the portion of the control signal provided to the VCO 214 by the feed-forward network 220 may not include a DC component and may include a portion of the AC component of the control signal. The portion of the AC component of the control signal may include the fundamental frequency of the reference signal and/or one or more harmonic frequencies of the reference signal, such as a first, second, and/or third harmonic frequencies of the reference signal that results in reference spurious signals in the output signal of the VCO 214.

The VCO 214 may be configured to generate the output signal based on the reference voltage signal from the voltage regulator 222 and the control signal from the control signal generation unit 212. In particular, the VCO 214 may be configured to generate a tuning signal based on the reference voltage signal and the control signal. The VCO 214 may then generate the output signal based on the tuning signal. In some embodiments, the tuning signal may include a DC component and an AC component. The VCO 214 may be configured to generate the output signal based on the DC component of the tuning signal. Reference spurious signals generated by the VCO 214 may be based on the AC component of the tuning signal.

The DC component of the tuning signal may be based on the reference voltage in the reference voltage signal and the DC component of the control signal. The AC component in the tuning signal may be based on the AC component of the control signal and the portion of the control signal in the reference voltage signal, which includes a portion of the AC component of the control signal. If the PLL 210 did not include the feed-forward network 220, an amplitude of the AC component of the tuning signal would be approximately equal to an amplitude of the AC component of the control signal. With the feed-forward network 220 providing a portion of the AC component of the control signal, the amplitude of the AC component of the tuning signal is reduced because the AC component of the control signal provided by the feed-forward network 220 and the AC component of the control signal may cancel at least a portion of each other out. In some embodiments, the AC component of the tuning signal may be reduced to approximately zero when higher order harmonics of the AC component of the tuning signal are ignored. In these and other embodiments, the portion of the AC component of the control signal provided by the feed-forward network 220 and the AC component of the control signal may cancel each other out. The reduction in the amplitude of the AC component of the tuning signal may reduce an amplitude of the reference spurious signals in the output signal generated by the VCO 214. Reduction in the amplitude of the reference spurious signals in the output signal may reduce the noise in the output signal.

In some embodiments, to help to maintain the amplitude of the AC component of the control signal provided by the feed-forward network 220 approximately equal to the amplitude of the AC component of the control signal, the feed-forward network 220 may have an approximately flat gain response within the pass band of the feed-forward network 220. In some embodiments, to achieve a flat gain response within the pass band of the feed-forward network 220, the feed-forward network 220, and, in particular, the voltage regulator 222 may have an output pole as the dominant pole in the transfer function of the voltage regulator 222.

If the gain response within the pass band of the feed-forward network 220 is not approximately flat, the portion of the AC component of the control signal provided by the feed-forward network 220 may be amplified. When the portion of the AC component of the control signal provided by the feed-forward network 220 is amplified, the AC component of the control signal may not cancel out with the portion of the AC component of the control signal provided by the feed-forward network 220 because each may have a different amplitude. As a result, the portion of the AC component of the control signal provided by the feed-forward network 220 may be passed to the tuning signal and result as reference spurious signals in the output signal.

Modifications, additions, or omissions may be made to FIG. 2 without departing from the scope of the present disclosure. For example, in some embodiments, the signal filter 224 may be part of the PLL 210 instead of being part of the feed-forward network 220. In some embodiments, the PLL 210 may be a type I, a type II, or a type III PLL. In some embodiments, the voltage regulator 222 may be a low-drop out regulator or some other type of non-correlated power supply. In some embodiments, the feed-forward network 220 and the PLL 210 may be part of an integrated circuit (IC). Alternately or additionally, the feed-forward network 220 and the PLL 210 may be located on separate ICs that are communicatively coupled.

Figure 3:
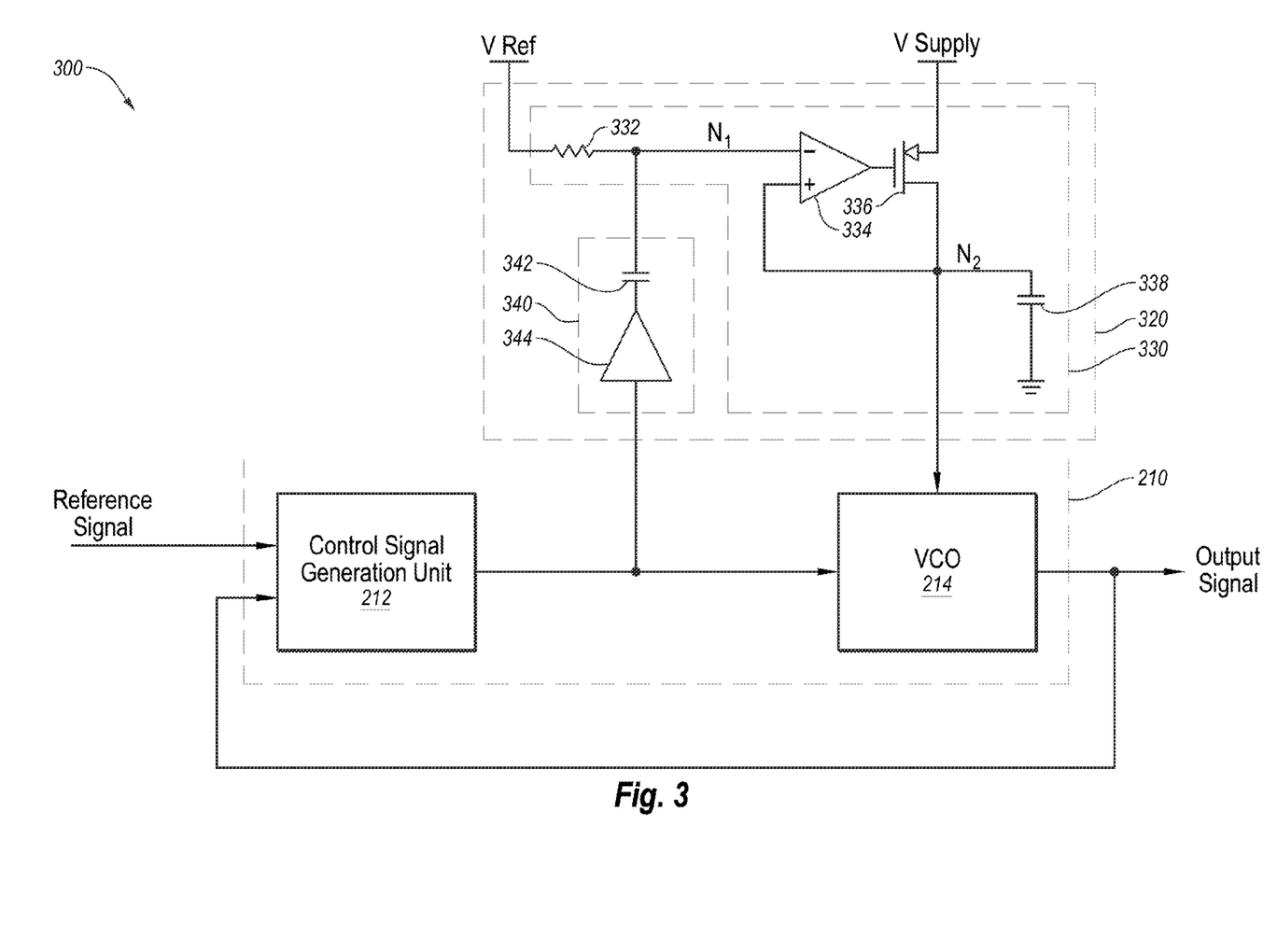
FIG. 3 is a block diagram of another example circuit that includes a PLL with a feed-forward network.

FIG. 3 is a block diagram of another example circuit 300 that includes the PLL 210 with a feed-forward network 320, arranged in accordance with at least some embodiments described herein. The PLL 210 may be similar to the PLL 210 of FIG. 2 and thus no further description is provided herein of the PLL 210. The feed-forward network 320 includes a voltage regulator 330 coupled to the VCO 214 and a signal filter 340 coupled to the voltage regulator 330 and to the control signal generation unit 212.

The signal filter 340 may include a buffer 344 and a capacitor 342. The buffer 344 may be communicatively coupled to the PLL 210 and the capacitor 342. The capacitor 342 may be communicatively coupled to the voltage regulator 330. The PLL 210 may be configured to send a control signal with a DC component and AC component to the signal filter 340. The buffer 344 may capacitively and/or inductively decouple the voltage regulator 330 from the PLL 210. The capacitor 342 may act as a high-pass filter that may remove the DC component of the control signal and a portion of the AC component of the control signal. In particular, the capacitor 342 may be configured to remove the portion of the AC component of the control signal that has frequencies within the loop bandwidth of the PLL 210. The capacitor 342 may send the filtered control signal to the voltage regulator 330.

The voltage regulator 330 may be configured to provide a reference voltage signal to the VCO 214. The reference voltage signal may include a portion of the control signal generated based on the filtered control signal from the signal filter 340 and a reference voltage source (V Ref). The reference voltage signal may be used by the VCO 214 to generate the output signal. The portion of the control signal may be used to cancel out the AC component of the control signal provided to the VCO 214 by the control signal generation unit 212.

The voltage regulator 330 may include a node N1, a node N2, a resistor 332, an amplifier 334, a transistor 336, and a decoupling capacitor 338. The resistor 332 may be coupled between the node N1 and the reference voltage source (V Ref). The node N1 may be coupled to a negative input of the amplifier 334. A positive input of the amplifier 334 may be coupled to the node N2. The output of the amplifier 334 may be coupled to a gate of the transistor 336. A source of the transistor 336 may be coupled to the voltage supply (V Supply). A drain of the transistor 336 may be coupled to the node N2. The decoupling capacitor 338 may be coupled between the node N2 and ground.

The amplifier 334, the transistor 336, the V Ref, and the V Supply configured as illustrated may provide the reference voltage of the reference voltage signal. The filtered control signal provided by the capacitor 342 may be received at node N1 of the voltage regulator 330. The filtered control signal may be combined at the node N1 with the reference voltage to form the reference voltage signal that is provided to the VCO 214. The reference voltage signal may pass through the amplifier 334 and from the gate of the transistor 336 to the node N2. As the reference voltage signal passes through the amplifier 334 and transistor 336, the reference voltage signal and thus the filtered control signal may be low pass filtered. As a result, the control signal may be filtered again. The twice-filtered control signal may be referred to herein as the portion of the control signal provided to the VCO 214. The decoupling capacitor 338 may be configured to reduce ripple in the reference voltage signal provided to the VCO 214.

Modifications, additions, or omissions may be made to FIG. 3 without departing from the scope of the present disclosure. For example, the signal filter 340 may not include the buffer 344. Furthermore, one or more passive and/or active components may be added to the feed-forward network 320. For example, another capacitor or resistor may be added to the signal filter 340 between the capacitor 342 and the voltage regulator 330.

Figure 4:
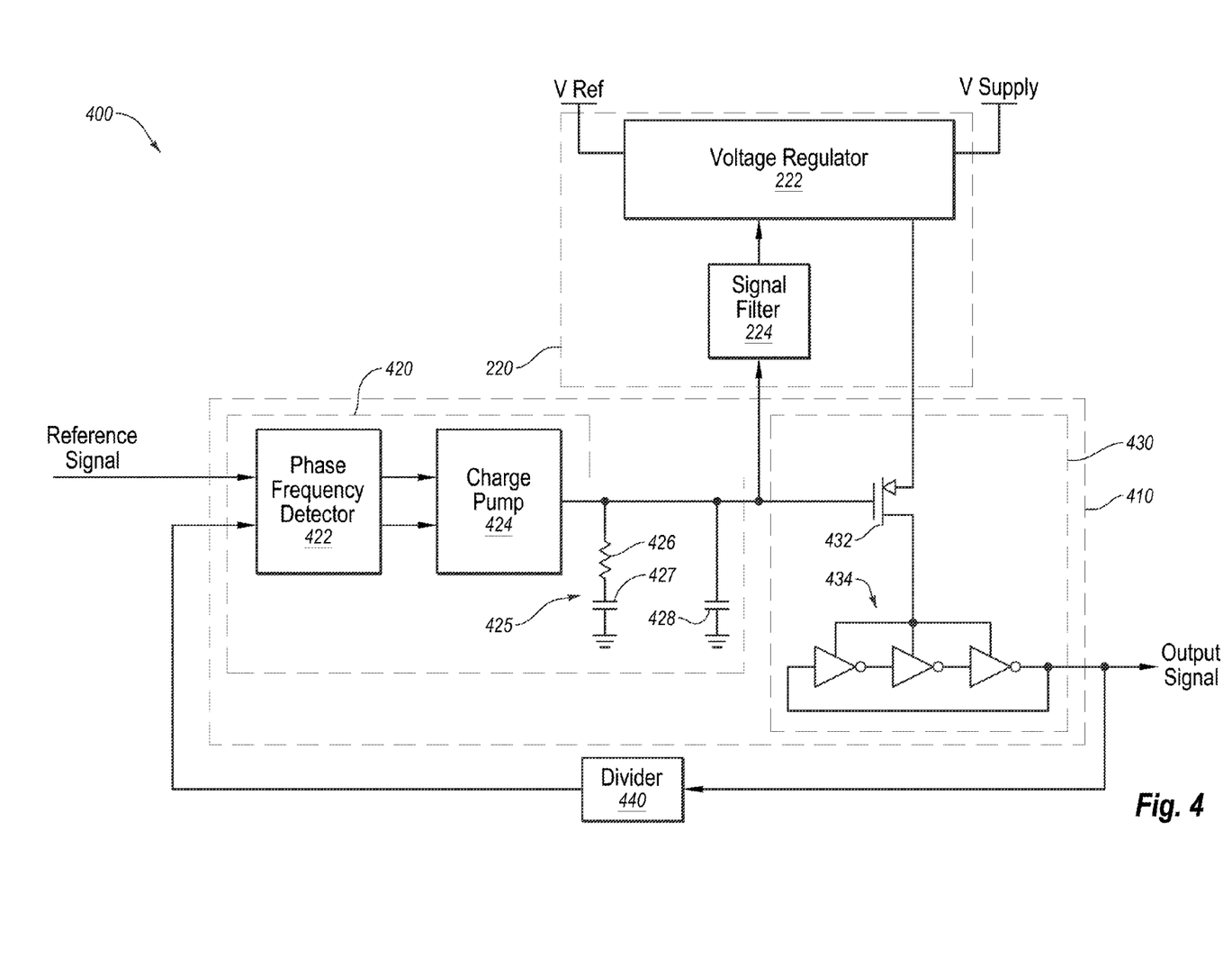
FIG. 4 is a block diagram of another example circuit that includes a PLL with a feed-forward network.

FIG. 4 is a block diagram of another example circuit 400 that includes a PLL 410 with the feed-forward network 220, arranged in accordance with at least some embodiments described herein. The feed-forward network 220 may be similar to the feed-forward network 220 of FIG. 2 and no further description is provide herein of the feed-forward network 220. In some embodiments, the feed-forward network 220 of FIG. 4 may be implemented as the feed-forward network 320 of FIG. 3. The PLL 410 includes a control signal generation unit 420 and a VCO 430 coupled to the control signal generation unit 420.

The control signal generation unit 420 may include a phase frequency detector 422, a charge pump 424 coupled to the phase frequency detector 422, and a loop filter 425 coupled to the charge pump 424, and may be configured to generate a control signal based on a phase difference between an output signal and a reference signal. The phase frequency detector 422 may be configured to determine the phase difference between the output signal and the reference signal. In some embodiments, the phase frequency detector 422 may be a tri-state phase frequency detector 422. The phase frequency detector 422 may have first and second outputs that may be coupled to the charge pump 424. In some embodiments, when the output signal is lagging the reference signal, the phase frequency detector 422 may send a signal on the first output. In these and other embodiments, when the output signal is leading the reference signal, the phase frequency detector 422 may send a signal on the second output. Alternately or additionally, when the output signal is leading the reference signal a signal is sent on the first output and when the output signal is lagging the reference signal a signal is sent on the second output.

Based on the signals from the first and second outputs, the charge pump 424 may supply current to or sink current from an output of the charge pump 424. For example, when a signal is on the first output, the charge pump 424 may supply current and when a signal is on the second output, the charge pump 424 may sink current.

The loop filter 425 may be configured to convert the current at the output of the charge pump 424 to the control signal. In some embodiments, the loop filter 425 may also act as a low pass filter that filters the control signal. The control signal may include a DC component and an AC component. The control signal may be sent to the feed-forward network 220 and the VCO 430.

The loop filter 425 may include a resistor 426, a first capacitor 427, and a second capacitor 428. The first capacitor 427 may be communicatively coupled to ground and the resistor 426. The resistor 426 may also be communicatively coupled to the output of the charge pump 424. The second capacitor 428 may be communicatively coupled between ground and the output of the charge pump 424. In some embodiments, the second capacitor 428 may be parasitic capacitance at the output of the charge pump 424 and thus may not be a physical capacitor within the circuit 400.

The VCO 430 may include a transistor 432 and a ring oscillator 434 and may be configured to generate an output signal. The transistor 432 may include a gate, a source, and a drain. The gate of the transistor 432 may be coupled to the control signal generation unit 420 and may be configured to receive the control signal. The source of the transistor 432 may be coupled to the feed-forward network 220 and may be configured to receive the reference voltage signal from the feed-forward network 220. The drain of the transistor 432 may be coupled to the ring oscillator 434.

Based on the control signal received at the gate of the transistor 432 and the reference voltage signal received at the source of the transistor 432, a tuning signal may be output by the drain of the transistor 432 and sent toward the ring oscillator 434. The ring oscillator 434 may be configured to generate the output signal based on the tuning signal received from the transistor 432.

The output of the drain of the transistor 432, e.g., the tuning signal, may be based on the signals at the gate and source of the transistor 432. The following equation indicates the relationship between the output of the drain of the transistor and the signals at the gate and source of the transistor 432:

$$I = \frac{1}{2} Kp \frac{W}{L} (R - C - |VTH|)2$$

where I is the current of the tuning signal, Kp is a device parameter of the transistor 432, W is the width of the channel of the transistor 432, L is the length of the channel of the transistor 432, R is the reference voltage signal, C is the control signal, and VTH is the threshold voltage of the transistor 432.

In the above equation, the AC components of the reference voltage signal and the control signal are subtracted from each other and the DC components of the reference voltage signal and the control signal are subtracted from each other. As a result, when the AC components of the reference voltage signal and the control signal are approximately equal, the tuning signal does not have an AC component and is based on the difference between the DC component of the reference voltage signal, e.g., the reference voltage, and the DC component of the control signal. When the tuning signal does not have an AC component, the output signal may not include any reference spurious signals.

In some embodiments, when higher order components of the AC component of the reference voltage signal and the control signal are ignored, the portion of the AC component of the reference voltage signal may be substantially similar to the AC component of the control signal. In these and other embodiments, the higher order portions of the AC component of the reference voltage signal and the control signal may be ignored because these higher order portions are such that they have a negligible effect on the output signal.

In some embodiments, depending on the channel length L of the transistor 432, the transistor 432 may be subject to short channel effects. For example, in some embodiments, a transistor with a channel length L of less than 1 micrometer may experience short channel effects. When the transistor 432 experiences short channel effects, the tuning signal is no longer based completely on the signals at the gate and source of the transistor 432, but is also based on the signals between the source and the drain of the transistor 432. As a result, the tuning signal may include some AC components of the signal at the source of the transistor 432, e.g., the reference voltage signal) even when the AC components of the signals at the source and the gate are cancelled out as illustrated in the above equation.

FIG. 4 further illustrates a divider 440 within a feedback loop of the PLL 410. The divider 440 may be coupled between the VCO 430 and the control signal generation unit 420, and may be configured to divide the output of the VCO 430 before the output is received by the control signal generation unit 420. In some embodiments, the divider 440 may divide the output by a number equal to or greater than one.

In FIGS. 3 and 4, the transistors in the circuits 300 and 400 may include complementary metal-oxide-semiconductor (CMOS) or bi-polar junction transistors (BJT) among other type of transistors, or some combination thereof. The above description references the gate, drain, and source of various transistors. The above description uses the nomenclature gate, drain, and source generically to represent different terminals of a transistor. The use of the names gate, drain, and source may be used to describe generically the terminals of a CMOS or BJT transistors. In some cases, a bulk (substrate) terminal of the CMOS transistors may also be referred to as a second gate terminal. Additionally, FIGS. 3 and 4 depict the transistors as being p-channel transistors. N-channel transistors or some combination of N-channel, P-channel, NPN, and/or PNP type transistors may also be used.

Additionally, modifications, additions, or omissions may be made to FIG. 4 without departing from the scope of the present disclosure. For example, the loop filter 425 may be an analog loop filter as illustrated in FIG. 4 or a sampled loop filter. As another example, the PLL 410 may not include the divider 440. Alternately or additionally, an oscillator within the VCO 430 may be a different type of oscillator than the ring oscillator 434 illustrated. Furthermore, one or more passive and/or active components may be added to the PLL 410.

Figure 5:
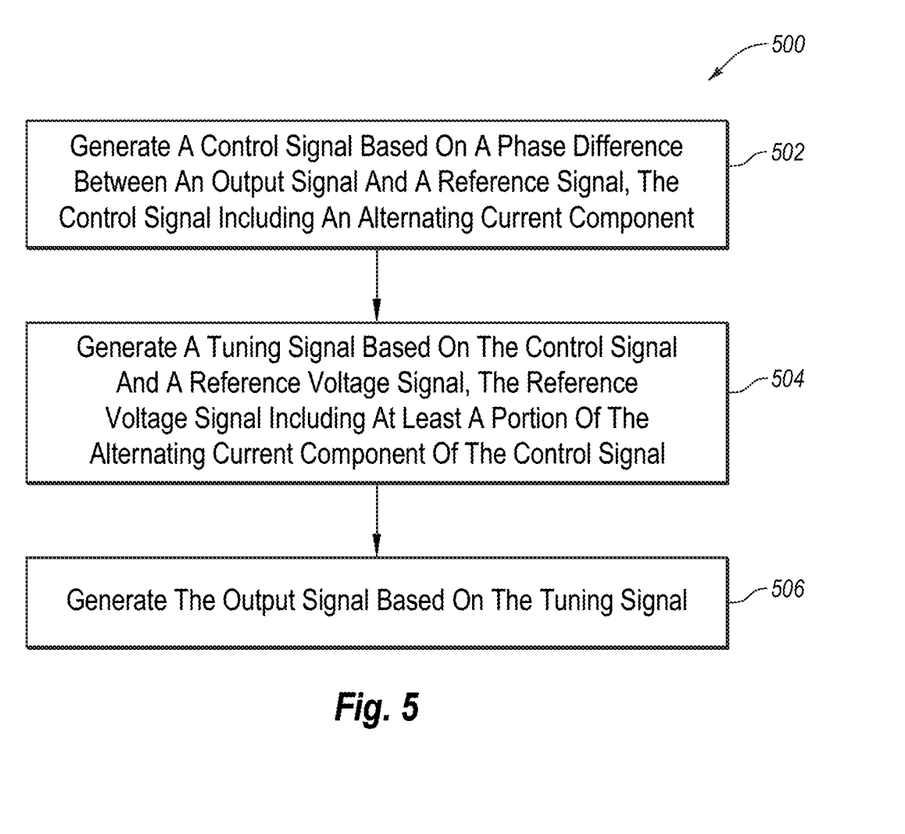
FIG. 5 is a flow diagram of an example method of reducing noise in an output of a phase-locked loop.

FIG. 5 illustrates an example flow diagram of a method 500 of reducing noise in an output of a phase-locked loop, arranged in accordance with at least some embodiments described herein. The method 500 may be performed in whole or in part by, e.g., the circuit 100 of FIG. 1, the circuit 200 of FIG. 2, the circuit 300 of FIG. 3, the circuit 400 of FIG. 4, and/or other version(s) thereof. The method 500 includes various operations, functions, or actions as illustrated by one or more of blocks 502, 504, and/or 506. The method 500 may begin at block 502.

In block 502 [Generate A Control Signal Based On A Phase Difference Between An Output Signal And A Reference Signal, The Control Signal Including An Alternating Current Component], a control signal based on a phase difference between an output signal and a reference signal may be generated. The control signal may include an AC component. In some embodiments, the AC component of the control signal may include one or more of a fundamental component or a harmonic component of the reference signal. In some embodiments, the AC component of the control signal may cause reference spurs in the output signal.

In some embodiments, the output signal may be divided before being used to generate the control signal. In these and other embodiments, the output signal may be divided by a number, greater than, or equal to one. Block 502 may be followed by block 504.

In block 504 [Generate A Tuning Signal Based On The Control Signal And A Reference Voltage Signal, The Reference Voltage Signal Including At Least A Portion Of The Alternating Current Component Of The Control Signal], a tuning signal may be generated based on the control signal and a reference voltage signal. The reference voltage signal may include at least a portion of the AC component of the control signal. In some embodiments, an amplitude of an AC component of the tuning signal may be less than an amplitude of the AC component of the control signal. In some embodiments, the AC component of the tuning signal may be approximately zero.

In some embodiments, an AC component of the tuning signal may be based on the AC component of the control signal and the at least a portion of the AC component of the reference voltage signal.

In some embodiments, the at least a portion of the AC component of the control signal included in the reference voltage signal may be a pass-band filtered portion of the AC component of the control signal. The frequencies of the pass-band filtered portion of the AC component of the control signal may include a fundamental frequency of the reference signal. Alternately or additionally, the frequencies of the pass-band filtered portion of the AC component of the control signal may include at least a first harmonic frequency of the reference signal among other harmonic frequencies of the reference signal.

In some embodiments, an amplitude of the AC component of the tuning signal may be less than an amplitude of the AC component of the control signal resulting from a cancellation between the AC component of the control signal and the at least a portion of the AC component of the reference voltage signal. Block 504 may be followed by block 506.

In block 506 [Generate The Output Signal Based On The Tuning Signal], the output signal may be generated based on the tuning signal.

For this and other processes and methods disclosed herein, the functions performed in the processes and methods may be implemented in differing order. Furthermore, the outlined acts and operations are only provided as examples, and some of the acts and operations may be optional, combined into fewer acts and operations, or expanded into additional acts and operations without detracting from the essence of the disclosed embodiments.

For example, the method 500 may further include filtering the control signal to generate a filtered control signal. In these and other embodiments, the DC components of the control signal may be removed during filtering of the control signal. In these and other embodiments, the method 500 may further include generating the reference voltage signal based on the filtered control signal.

As another example, the method 500 may further include generating the control signal based on a current supplied by a charge pump. The current may be based on the phase difference between the output signal and the reference signal.

Figure 6:
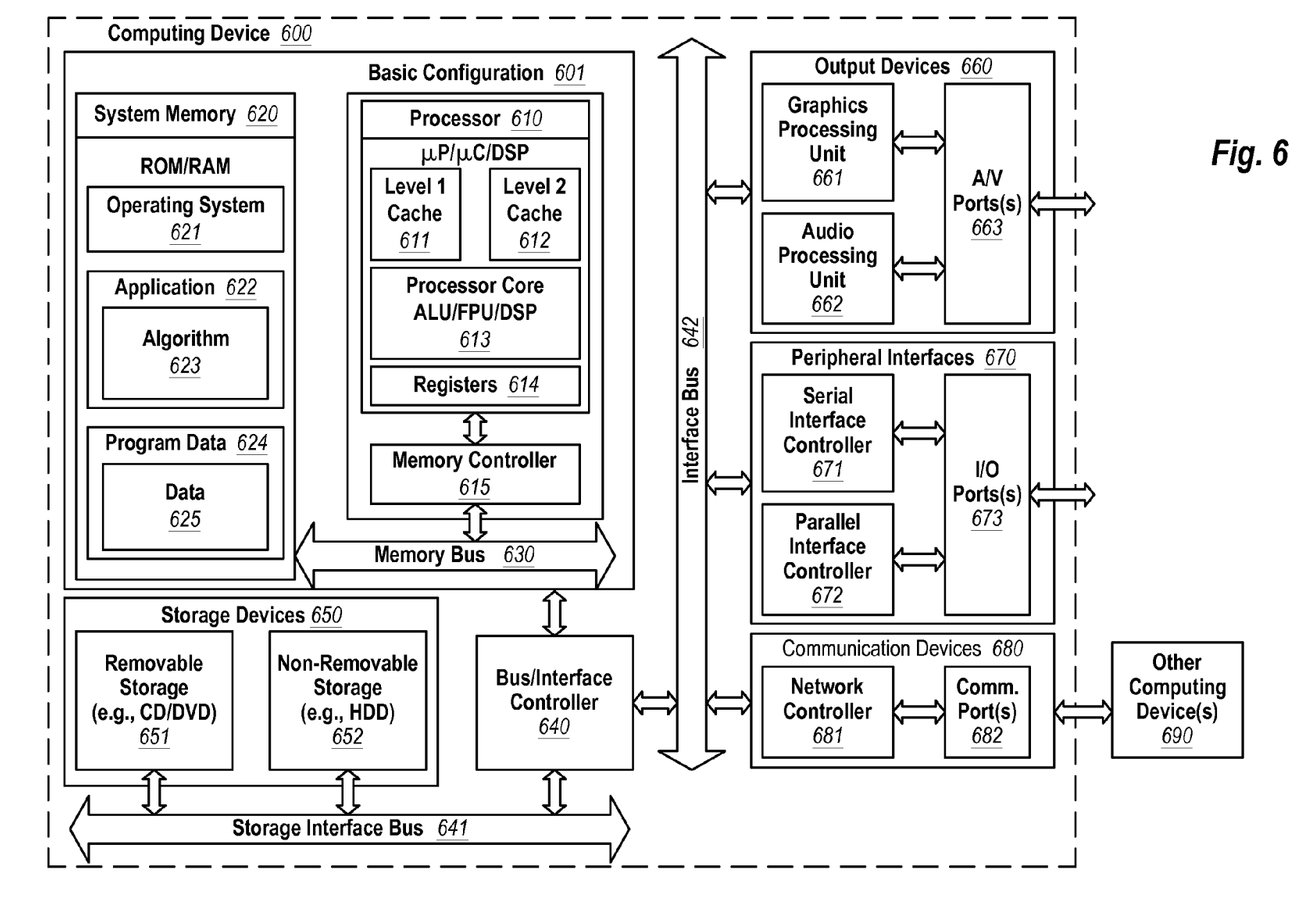
FIG. 6 is a block diagram illustrating an example computing device in which the circuit(s) and method(s) may be implemented, all arranged in accordance with at least some embodiments described herein.

FIG. 6 is a block diagram illustrating an example computing device 600 in which the circuit(s) and method(s) in accordance with the present disclosure may be implemented. In a very basic configuration 601, computing device 600 typically includes one or more processors 610 and system memory 620. A memory bus 630 can be used for communicating between the processor 610 and the system memory 620.

Depending on the desired configuration, processor 610 can be of any type including but not limited to a microprocessor (µP), a microcontroller C), a digital signal processor (DSP), or any combination thereof. Processor 610 can include one more levels of caching, such as a level one cache 611 and a level two cache 612, a processor core 613, and registers 614. The processor core 613 can include an arithmetic logic unit (ALU), a floating point unit (FPU), a digital signal processing core (DSP Core), or any combination thereof. In some embodiments, the processor 610 may implement the various PLL-related circuit(s) and method(s) described above. For example, the processor 610 may implement the various PLL-related circuit(s) and method(s) described above for a clock distribution system within the processor 610. A memory controller 615 can also be used with the processor 610, or in some implementations the memory controller 615 can be an internal part of the processor 610.

Depending on the desired configuration, the system memory 620 can be of any type including but not limited to volatile memory (such as RAM), non-volatile memory (such as ROM, flash memory, etc.) or any combination thereof. In some embodiments, the system memory 620 may implement the various PLL-related circuit(s) and method(s) described above. For example, the system memory 620 may implement the various PLL-related circuit(s) and method(s) described above for a clock distribution system within the system memory 620. System memory 620 typically includes an operating system 621, one or more applications 622, and program data 624. Application 622 may include an algorithm 623. Program Data 624 includes data 625 that is usable in connection with execution of the algorithm 623. In some embodiments, application 622 can be arranged to operate with program data 624 on an operating system 621. This described basic configuration is illustrated in FIG. 6 by those components within dashed line 601.

Computing device 600 can have additional features or functionality, and additional interfaces to facilitate communications between the basic configuration 601 and any required devices and interfaces. For example, a bus/interface controller 640 can be used to facilitate communications between the basic configuration 601 and one or more data storage devices 650 via a storage interface bus 641. The data storage devices 650 can be removable storage devices 651, non-removable storage devices 652, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 620, removable storage 651 and non-removable storage 652 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 600. Any such computer storage media can be part of device 600.

Computing device 600 can also include an interface bus 642 for facilitating communication from various interface devices (e.g., output interfaces, peripheral interfaces, and communication interfaces) to the basic configuration 601 via the bus/interface controller 640. Example output devices 660 include a graphics processing unit 661 and an audio processing unit 662, which can be configured to communicate to various external devices such as a display or speakers via one or more A/V ports 663. Example peripheral interfaces 670 include a serial interface controller 671 or a parallel interface controller 672, which can be configured to communicate with external devices such as input devices (e.g., keyboard, mouse, pen, voice input device, touch input device, etc.) or other peripheral devices (e.g., printer, scanner, etc.) via one or more I/O ports 673. An example communication device 680 includes a network controller 681, which can be arranged to facilitate communications with one or more other computing devices 690 over a network communication via one or more communication ports 682. The communication device 680 of one embodiment may implement the various PLL-related circuit(s) and method(s) described above. For example, the communication device 680 may include an optical port that may implement the various PLL-related circuit(s) and method(s) described above in a clock and data recovery circuit. Alternatively or additionally, the various PLL-related circuit(s) and method(s) described above may be implemented elsewhere in the computing device 600.

The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 600 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 600 can also be implemented as a personal computer including both laptop computer and non-laptop computer configurations.

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible sub ranges and combinations of sub ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into sub ranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A circuit comprising:
   a voltage-controlled oscillator configured to generate an output signal;
   a control signal generation unit coupled to the voltage-controlled oscillator, and configured to generate a control signal based on the output signal and to provide the control signal to the voltage-controlled oscillator; and
   a feed-forward network, coupled to the voltage-controlled oscillator and to the control signal generation unit, the feed-forward network configured to receive the control signal and to provide a portion of the received control signal to the voltage-controlled oscillator, the voltage-controlled oscillator configured to generate the output signal based on the control signal from the control signal generation unit and the portion of the received control signal provided from the feed-forward network.

2. The circuit of claim 1, wherein the control signal generation unit comprises a phase frequency detector configured to determine a phase difference between the output signal and a reference signal, the control signal being based on the phase difference between the output signal and the reference signal.

3. The circuit of claim 2, wherein the portion of the received control signal provided by the feed-forward network to the voltage-controlled oscillator includes a fundamental frequency of the reference signal or a first harmonic frequency of the reference signal.

4. The circuit of claim 1, wherein the feed-forward network includes:
   a voltage regulator coupled to the voltage-controlled oscillator and configured to provide a reference voltage signal to the voltage-controlled oscillator; and
   a filter coupled to the voltage regulator and configured to filter the received control signal to remove at least a direct current component of the received control signal and direct the filtered received control signal to the voltage regulator.

5. The circuit of claim 4, wherein the voltage-controlled oscillator is configured to generate the output signal based on the control signal from the control signal generation unit, the portion of the filtered received control signal provided from the feed-forward network, and the reference voltage signal configured to be generated by the voltage regulator.

6. A circuit comprising:
   a control signal generation unit configured to generate a control signal based on a phase difference between an output signal and a reference signal, the control signal including an alternating current component;
   a feed-forward network comprising a voltage regulator coupled to the control signal generation unit and configured to receive the control signal and to generate a reference voltage signal that includes at least a portion of the alternating current component of the control signal as received from the control signal generation unit; and
   a voltage-controlled oscillator coupled to the control signal generation unit and to the voltage regulator, and configured to generate a tuning signal based on the control signal and the reference voltage signal generated by the feed-forward network and configured to generate the output signal based on the tuning signal.

7. The circuit of claim 6, wherein an amplitude of an alternating current component of the tuning signal is less than an amplitude of the alternating current component of the control signal resulting from a cancellation between the alternating current component of the control signal and the at least the portion of the alternating current component of the control signal included in the reference voltage signal.

8. The circuit of claim 6, wherein the voltage-controlled oscillator includes a transistor with a gate, a source, and a drain, the gate configured to receive the control signal and the source configured to receive the reference voltage signal generated by the feed-forward network.

9. The circuit of claim 8, wherein the drain is configured to output the tuning signal based on the control signal received at the gate and the reference voltage signal received at the source.

10. The circuit of claim 6, wherein the feed-forward network further comprises a filter communicatively coupled between the control signal generation unit and the voltage regulator, the filter configured to filter the control signal to remove at least direct current components of the control signal and direct the filtered control signal toward the voltage regulator.

11. The circuit of claim 6, wherein the at least a portion of the alternating current component of the control signal included in the reference voltage signal is a pass-band filtered portion of the alternating current component of the control signal.

12. The circuit of claim 11, wherein frequencies of the pass-band filtered portion of the alternating current component of the control signal includes a fundamental frequency of the reference signal or a first harmonic frequency of the reference signal.

13. The circuit of claim 11, wherein a lower frequency of the pass-band filtered portion of the alternating current component of the control signal is higher than a loop bandwidth of the control signal generation unit and the voltage-controlled oscillator.

14. A circuit comprising:
   a control signal generation unit configured to generate a control signal based on a phase difference between an output signal and a reference signal, the control signal including an alternating current component; and
   a voltage-controlled oscillator coupled to the control signal generation unit and configured to:
      receive the control signal from the control signal generation unit,
      generate a tuning signal based on the received control signal and a reference voltage signal that includes at least a portion of the alternating current component of the control signal, and
      generate the output signal based on the tuning signal.

15. The circuit of claim 14, wherein an alternating current component of the tuning signal is based on the alternating current component of the control signal and the at least a portion of alternating current component of the control signal included in the reference voltage signal.

16. The circuit of claim 14, further comprising a feed-forward network comprising a voltage regulator coupled to the voltage controlled oscillator and configured to generate the reference voltage signal.

17. The circuit of claim 16, wherein the feed-forward network further comprises a filter communicatively coupled between the control signal generation unit and the voltage regulator, the filter configured to filter the control signal to remove at least direct current components of the control signal and direct the filtered control signal toward the voltage regulator.

18. A method to reduce noise in an output of a phase-locked loop, the method comprising:
   generating a control signal based on a phase difference between an output signal and a reference signal, the control signal including an alternating current component;
   generating a reference voltage signal that includes at least a portion of the alternating current component of the control signal;
   generating a tuning signal based on the control signal and the reference voltage signal; and
   generating the output signal based on the tuning signal.

19. The method of claim 18, wherein an alternating current component of the tuning signal is based on the alternating current component of the control signal and the at least a portion of the alternating current component of the control signal included in the reference voltage signal.

20. The method of claim 18, further comprising filtering the control signal to remove direct current components of the control signal.

* * * * *